(12) United States Patent  
Cheng et al.

(10) Patent No.: US 10,635,216 B2  
(45) Date of Patent: Apr. 28, 2020

(54) SIGNAL EXTRACTION CIRCUIT, DETECTION CIRCUIT AND DETECTION METHOD, TOUCH PANEL AND DISPLAY DEVICE

(71) Applicant: BOE TECHNOLOGY GROUP CO., LTD., Beijing (CN)

(72) Inventors: Chih Jen Cheng, Beijing (CN); Yuzhen Guo, Beijing (CN); Haisheng Wang, Beijing (CN); Xiaoliang Ding, Beijing (CN); Pengpeng Wang, Beijing (CN); Yingming Liu, Beijing (CN); Yanling Han, Beijing (CN); Bo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/220,128

(22) Filed: Dec. 14, 2018

(65) Prior Publication Data  
US 2019/0324581 A1  Oct. 24, 2019

(30) Foreign Application Priority Data  
Apr. 23, 2018 (CN) .......... 2018 1 0368965

(51) Int. Cl.  
G06F 3/044 (2006.01)  
G06F 3/041 (2006.01)  
H01L 41/04 (2006.01)  
H03K 17/96 (2006.01)  
H03M 1/12 (2006.01)

(52) U.S. Cl.  
CPC .......... G06F 3/0412 (2013.01); G06F 3/044 (2013.01); H01L 41/042 (2013.01); H03K 17/962 (2013.01); H03M 1/12 (2013.01)

(58) Field of Classification Search  
CPC ......... G06F 1/3262; G06F 2203/04106; G06F 3/0412; G06F 3/04144; G06F 3/0416; G06F 3/044; G06F 3/0443; G06F 3/0446; H01L 41/042; H03K 17/962; H03M 1/12  
See application file for complete search history.

(56) References Cited

U.S. PATENT DOCUMENTS 7,667,371 B2 * 2/2010 Sadler ............... G06F 3/016  
310/317  
2006/0017705 A1 * 1/2006 Yoshikawa ........ G06F 3/016  
345/173

* cited by examiner

Primary Examiner — Insa Sadio  
(74) Attorney, Agent, or Firm — Calfee, Halter & Griswold LLP

(57) ABSTRACT

A signal extraction circuit includes: a first storage sub-circuit configured to receive a first signal including superimposed first touch signal and piezoelectric signal; a second storage sub-circuit configured to receive a second signal including superimposed second touch signal and piezoelectric signal, a phase of the second touch signal being opposite to a phase of the first touch signal; and an output sub-circuit configured to output the piezoelectric signals according to the first signal and the second signal during a third time period.

20 Claims, 8 Drawing Sheets

SIGNAL EXTRACTION CIRCUIT, DETECTION CIRCUIT AND DETECTION METHOD, TOUCH PANEL AND DISPLAY DEVICE

CROSS-REFERENCE TO RELATED APPLICATIONS

The present application claims priority to Chinese Patent Application No. 201810368965.4 and filed Apr. 23, 2018, the entire contents of which are incorporated herein by reference.

TECHNICAL FIELD

The present disclosure relates to the field of display, and in particular, to a signal extraction circuit, a signal detection circuit including the signal extraction circuit, a signal detection method, a touch panel including the signal detection circuit and a display device.

BACKGROUND

With the rapid development of display technologies, touch panels have been gradually spreading throughout people's lives. According to a sensing manner, the touch panels can be classified into resistive touch panels, capacitive touch panels and electromagnetic touch panels; and according to constitution, the touch panels can be divided into Add on Mode Touch Panels, On Cell Touch Panels, and In Cell Touch Panels.

Piezoelectric sensing technologies can detect an external force, and are gradually being applied to portable electronic display devices such as mobile phones or tablets to improve touch precision. However, when a conventional display device that implements the piezoelectric sensing technology detects a touch signal, a piezoelectric signal is also transmitted to an output terminal of a charge amplifier at the same time, and when it is desired to confirm the piezoelectric signal on a piezoelectric sensor after the detection of the touch is completed, the piezoelectric signal is no longer existing, thus the pressure detection is failed. Moreover, when a piezoelectric touch signal is detected by adopting a conventional technology, it is necessary to start some complicated, high-power circuits, which will greatly increase power consumption of a touch detection chip.

In view of this, there is an urgent need in the art for a signal detection circuit and a signal detection method which simultaneously collect touch signals and pressure signals and reduce power consumption of a chip.

It should be noted that the foregoing information disclosed in Background are only for the purpose of enhancement of the understanding of the background of the present disclosure and therefore the information can include information that does not constitute the prior art already known to those of ordinary skill in the art.

SUMMARY

Other features and advantages of the present disclosure will be apparent from the following detailed descriptions, and may be partially learned by practice of the present disclosure.

According to a first aspect of the present disclosure, there is provided a signal extraction circuit, including:

a first storage sub-circuit connected to an input terminal and configured to receive and store a first signal inputted from the input terminal during a first time period, the first signal including a first touch signal and a piezoelectric signal which are superimposed;

a second storage sub-circuit connected to the input terminal and configured to receive and store a second signal inputted from the input terminal during a second time period, the second signal including a second touch signal and a piezoelectric signal which are superimposed, and a phase of the second touch signal being opposite to a phase of the first touch signal;

an output sub-circuit connected to the first storage sub-circuit, the second storage sub-circuit, and an output terminal and configured to output the piezoelectric signals from the output terminal based on the first signal and the second signal during a third time period;

wherein the first time period and the second time period are different time periods having the same time of duration in a touch event.

In an exemplary embodiment of the present disclosure, the first storage sub-circuit includes a first switch and a first capacitor, a first terminal of the first switch is configured to receive the first signal, a second terminal of the first switch is connected to a first terminal of the first capacitor, and a second terminal of the first capacitor is grounded.

In an exemplary embodiment of the present disclosure, the second storage sub-circuit includes a second switch and a second capacitor, a first terminal of the second switch is configured to receive the second signal, a second terminal of the second switch is connected to a first terminal of the second capacitor, and a second terminal of the second capacitor is grounded.

In an exemplary embodiment of the present disclosure, the output sub-circuit includes a third switch, a first terminal of the third switch is connected to the first terminal of the first capacitor, and a second terminal of the third switch is configured to output the piezoelectric signals.

According to a second aspect of the present disclosure, there is provided a signal detection circuit, including:

a signal extraction sub-circuit which is the signal extraction circuit described above;

a piezoelectric touch sub-circuit configured to generate a first sensing signal and a second sensing signal under the driving of a driving signal;

a detection sub-circuit connected to the piezoelectric touch sub-circuit and the signal extraction sub-circuit and configured to output the first signal and the second signal to the signal extraction sub-circuit according to the first sensing signal and the second sensing signal.

In an exemplary embodiment of the present disclosure, the piezoelectric touch sub-circuit includes:

a sensing electrode layer including a plurality of sensing electrodes distributed in a first direction;

a driving electrode layer including a plurality of driving electrodes distributed in a second direction which intersects the first direction; and a piezoelectric layer positioned between the sensing electrode layer and the driving electrode layer.

In an exemplary embodiment of the present disclosure, the detection sub-circuit includes:

an amplifier configured to generate the first signal and the second signal according to the first sensing signal and the second sensing signal;

a control switch configured to control turn-on or turn-off of the piezoelectric touch sub-circuit and the amplifier;

a reset switch configured to reset the amplifier when the control switch is turned off.

In an exemplary embodiment of the present disclosure, the signal detection circuit further includes:

a collecting sub-circuit configured to collect the first signal, the second signal, and the piezoelectric signal.

In an exemplary embodiment of the present disclosure, the signal detection circuit further includes:

an analog-to-digital conversion sub-circuit configured to convert the collected first signal, second signal, and piezoelectric signal into digital signals.

In an exemplary embodiment of the present disclosure, the signal detection circuit further includes:

a touch signal extraction sub-circuit configured to subtract the digital signals of the first signal and the second signal from the digital signal of the piezoelectric signal to generate the touch signal.

According to a third aspect of the present disclosure, there is provided a signal detection method, which is applied to the above-described signal detection circuit, and includes:

driving the piezoelectric touch sub-circuit by a driving signal to generate the first sensing signal and the second sensing signal;

the detection sub-circuit receiving the first sensing signal and the second sensing signal, and outputting the first signal and the second signal; and the signal extraction sub-circuit outputting the piezoelectric signal according to the first signal and the second signal.

According to a fourth aspect of the present disclosure, there is provided a touch panel including the above-described signal detection circuit.

According to a fifth aspect of the present disclosure, there is provided a display device including the above-described touch panel.

It shall be understood that the above general description and the following detailed description are merely exemplary and explanatory and are not intended to be restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. It will be obvious that the drawings in the following descriptions are some embodiments of the present disclosure only, and those ordinary skilled in the art may obtain other drawings form these drawings without paying any creative labor.

DETAILED DESCRIPTION

Figure 1:
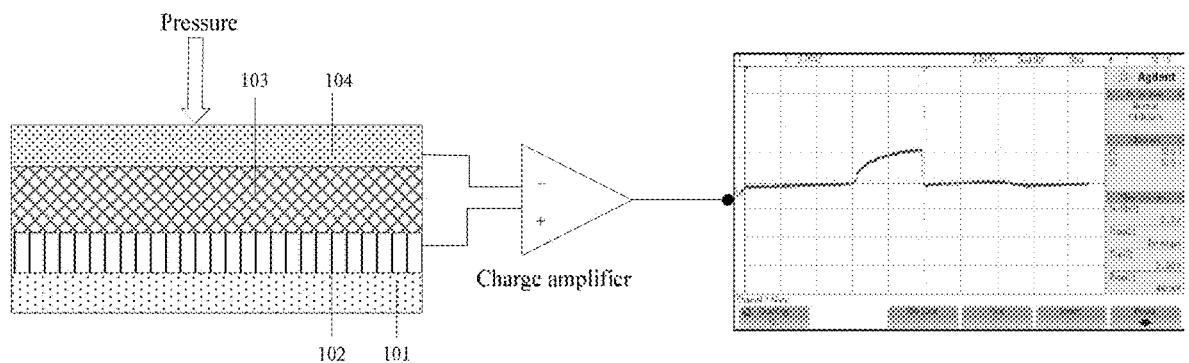
FIG. 1 is a structural schematic diagram illustrating a piezoelectric material in the related art.

The exemplary embodiments will now be described more fully with reference to the accompanying drawings. However, the exemplary embodiments can be implemented in various forms and should not be understood as being limited to the examples set forth herein; rather, these embodiments are provided so that this disclosure will be thorough and complete, and the conception of exemplary embodiments will be fully conveyed to those skilled in the art. The features, structures or characteristics described herein may be combined in one or more embodiments in any suitable manner. In the following description, numerous specific details are provided so as to allow a full understanding of the embodiments of the present disclosure. However, those skilled in the art will recognize that the technical solutions of the present disclosure may be practiced without one or more of the specific details, or other methods, components, devices, steps and so on may be used. In other cases, the well-known technical solutions are not shown or described in detail to avoid obscuring various aspects of the present disclosure.

In the present specification, terms "a", "an", "the" and "said" are used to denote the presence of one or more elements/constituent parts/etc.; terms "including" and "having" represent open including and refer to additional elements/constituent parts/etc. in addition to the listed elements/constituent parts/etc.; terms "first", "second" and "third" are only used as a token, rather than a limit on the number of objects.

In addition, the drawings are merely schematic illustrations of the present disclosure and are not necessarily drawn to scale. The same reference numerals in the drawings refer to same or similar parts, and the repeated descriptions thereof will be omitted. Some of the block diagrams shown in the drawings are functional entities and do not necessarily correspond to physically or logically separate entities.

In the art, piezoelectric materials are often used to detect pressure change, and generally have a sandwich structure. As shown in FIG. 1, a transparent conductive oxide layer 102, a piezoelectric material layer 103, and a metal material layer 104 are sequentially disposed on a glass substrate 101, wherein the transparent conductive oxide layer 102 may be ITO, AZO, ATO or the like; the piezoelectric material layer 103 may be one or more of an inorganic piezoelectric material, an organic piezoelectric material, and a composite piezoelectric material. The inorganic piezoelectric material may be barium titanate, lead zirconate titanate, lead metaniobate, or the like, the organic piezoelectric material may be PVDF and other organic piezoelectric materials. The metal material layer 104 may be a metal material which has a high conductivity such as Au, Ag, Cu.

When a pressure is applied to the metal material layer 104, charges in the piezoelectric material layer 103 are varied, which will cause a change in an output voltage. A touch sensor has a similar structure to that as shown in FIG. 1, in terms of a mutual capacitance structure, the transparent conductive oxide layer 102 can be equivalent to a driving electrode TX, and the metal material layer 104 can be equivalent to a sensing electrode RX. In terms of a self-capacitance structure, the transparent conductive oxide layer 101 can be equivalent to a reference potential, and the metal material layer 104 can be equivalent to a driving electrode and a sensing electrode, so that a piezoelectric signal and a touch signal can be simultaneously detected by the structure as shown in FIG. 1.

Figure 2:
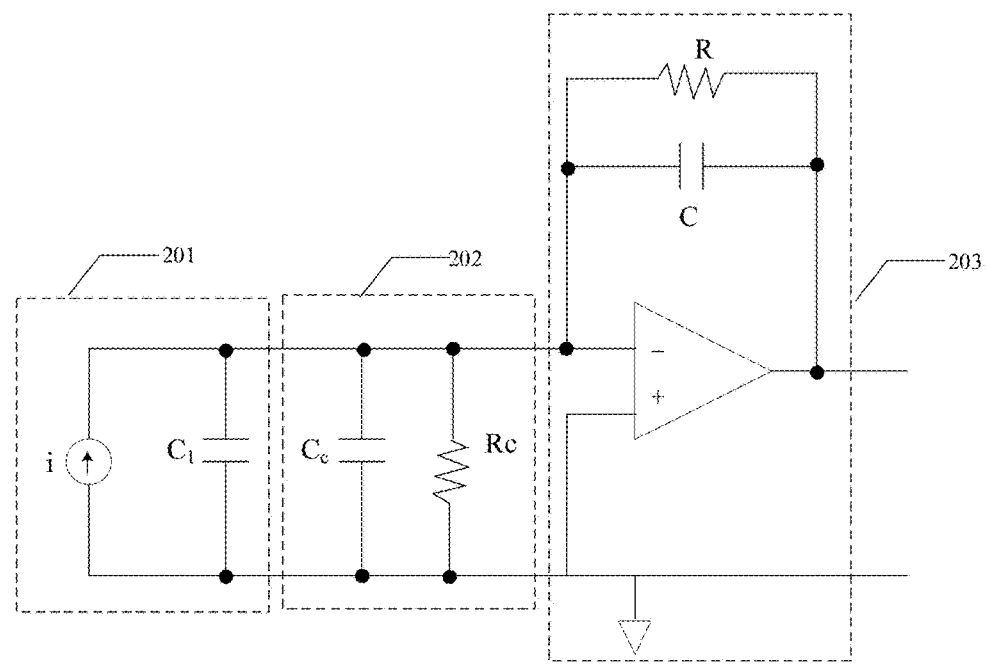
FIG. 2 is a structure diagram illustrating a piezoelectric detection circuit in the related art.

FIG. 2 shows a piezoelectric detection circuit in the related art. As shown in FIG. 2, the piezoelectric detection circuit 200 includes a sensor 201, a cable 202, and a charge amplifier 203. The sensor 201 includes a current source i and a capacitor $C_1$. The cable 202 includes a capacitor $C_C$ and a resistor $R_c$. The charge amplifier 203 includes an operational amplifier, a capacitor C, and a resistor R. The piezoelectric detection circuit 200 uses the operational amplifier to amplify and output a charge signal of the piezoelectric sensor. Since a fixed feedback DC voltage is supplied at a negative terminal of the operational amplifier, a charge signal generated by a pressure is quickly transferred from the sensor 201 to an output terminal on the right side of the charge amplifier 203, and the charge signal in the sensor cannot be remain on the sensor 201.

In order to support multi-touch, the circuit will be driven in the manner of scanning, but there is a difficulty in piezoelectric pressure detection, that is, the piezoelectric signal (charge) is also transmitted to the output terminal of the charge amplifier while the touch signal is being detected, and when it is desired to confirm the signal on the piezoelectric sensor after the detection of the touch signal is completed, the piezoelectric signal is no longer existing, thus the pressure detection is failed, and a touch position cannot be accurately determined. In addition, in order to detect the touch signal, it is necessary to start some complicated, high-power circuits, which will greatly increase power consumption of a chip.

Figure 3:
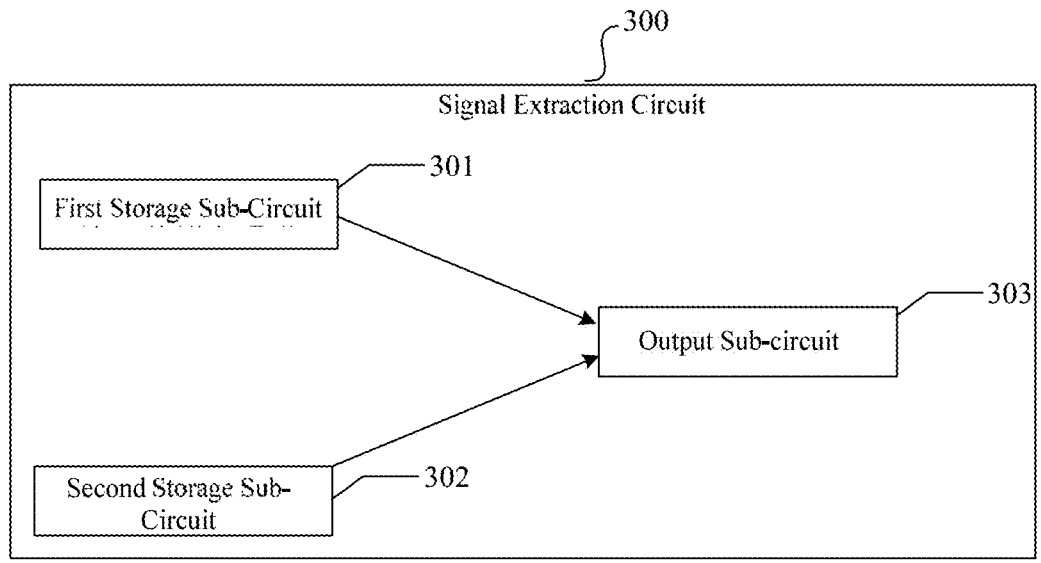
FIG. 3 is a structural schematic diagram illustrating a signal extraction circuit according to an exemplary embodiment of the present disclosure.

In view of the problems in the related art, the present disclosure provides a signal extraction circuit, one of main functions of which is to extract a piezoelectric signal based on a piezoelectric touch signal. FIG. 3 is a structural schematic diagram illustrating a signal extraction circuit. As shown in FIG. 3, the signal extraction circuit 300 includes a first storage sub-circuit 301, a second storage sub-circuit 302, and an output sub-circuit 303. The first storage sub-circuit 301 is connected to an input terminal of the signal extraction circuit 300 for receiving and storing a first signal $Sn_1$ input from the input terminal during a first time period $t_1$. In this exemplary embodiment, the first storage sub-circuit 301 may store the first signal $Sn_1$ input from the input terminal by a capacitor, a capacitor bank or other storage elements; and the first signal $Sn_1$ includes a first touch signal $TC_1$ and a piezoelectric signal PS which are superposed. The second storage sub-circuit 302 is connected to the input terminal of the signal extraction circuit 300 for receiving and storing a second signal $Sn_2$ input from the input terminal during a second time period $t_2$. In this exemplary embodiment, the second storage sub-circuit 302 may store the second signal $Sn_2$ input from the input terminal by a capacitor, a capacitor group or other storage elements; and the second signal $Sn_2$ includes a second touch signal $TC_2$ and a piezoelectric signal PS which are superposed. In this exemplary embodiment, the first time period $t_1$ and the second time period $t_2$ are different time periods having the same duration in one touch event; for example, taking one touch event having time of duration of 1000 milliseconds for an example, the first time period $t_1$ may be of 100~300 milliseconds, and the second time period $t_2$ may be of 300~500 milliseconds. Alternatively, the first time period $t_1$ may be of 600~900 milliseconds, and the second time period $t_2$ may be of 300~600 milliseconds; additionally, the first time period $t_1$ may be of 100~300 milliseconds, and the second time period $t_2$ may be of 500~700 milliseconds, that is to say, the first time period $t_1$ and the second time period $t_2$ may be adjacent time periods, or may be non-adjacent time periods, the first time period $t_1$ is before the second time period $t_2$, or the first time period $t_1$ is after the second time period $t_2$. This is not particularly limited in this exemplary embodiment.

The output sub-circuit 303 is connected to the first storage sub-circuit 301, the second storage sub-circuit 302, and an output terminal of the signal extraction circuit 300 for outputting a piezoelectric signal PS from the output terminal according to the first signal $Sn_1$ and the second signal $Sn_2$ during a third time period $t_3$. In this exemplary embodiment, the third time period $t_3$ is a time period after the first time period $t_1$ and the second time period $t_2$, which may fall into or exceed the time of duration of the above touch event. In order to accurately extract the piezoelectric signal, in this exemplary embodiment, the first touch signal $TC_1$ has a phase opposite to that of the second touch signal $TC_2$. In this way, after the output sub-circuit 303 receives the first signal $Sn_1$ and the second signal $Sn_2$, the first touch signal $TC_1$ and the second touch signal $TC_2$ cancel each other, and only the piezoelectric output is outputted from the output terminal of the signal extraction circuit 300.

In view of the above, the signal extraction circuit in the present disclosure can, on one hand, separate the piezoelectric signal from the superimposed signals to be outputted, and then obtain the touch signal by removing the piezoelectric signal from the superimposed signals so as to realize the simultaneous acquisition of the touch signal and the piezoelectric signal, and on the other hand, pre-determine the occurrence of touch based on the extracted piezoelectric signal, and then determine the position of touch according to the touch signal, in this way, the startup of some complicated, high-power circuits is avoided, and the power consumption of the chip is saved.

Figure 4:
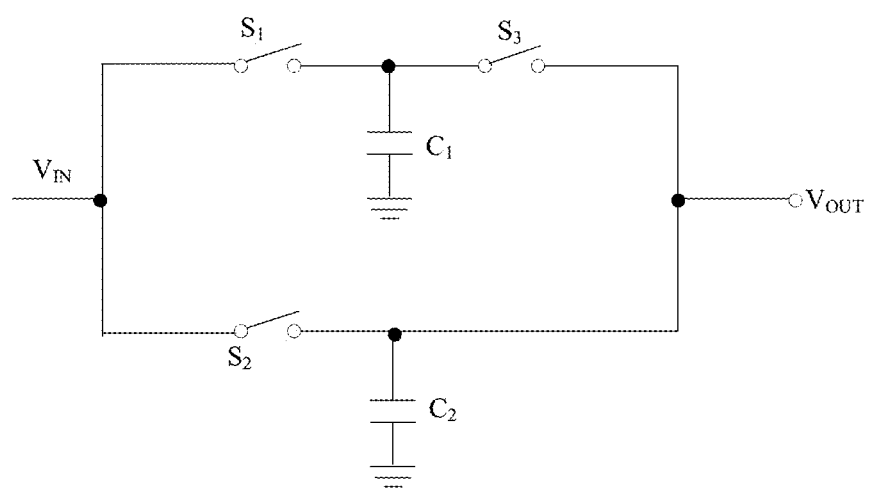
FIG. 4 is a circuit diagram illustrating a signal extraction circuit according to an exemplary embodiment of the present disclosure.

In an exemplary embodiment of the present disclosure, FIG. 4 is a circuit diagram illustrating the signal extraction circuit. As shown in FIG. 4, the first storage sub-circuit 301 includes a first switch $S_1$ and a first capacitor $C_1$, the second storage sub-circuit 302 includes a second switch $S_2$ and a second capacitor $C_2$, and the output sub-circuit 303 includes a third switch S3, wherein first terminals of the first switch $S_1$ and the second switch $S_2$ are configured to receive an input voltage $V_{IN}$, which includes the first signal $Sn_1$ and the second signal $Sn_2$, a second terminal of the first switch $S_1$ is connected to a first terminal of the first capacitor $C_1$, and a second terminal of the first capacitor $C_1$ is grounded, and a second terminal of the second switch $S_2$ is connected to a first terminal of the second capacitor $C_2$, and a second terminal of the second capacitor $C_2$ is grounded; a first terminal of the third switch $S_3$ is connected to the second terminals of the first capacitor $C_1$ and the second capacitor $C_2$, and a second terminal of the third switch $S_3$ is used for outputting an output voltage $V_{OUT}$, which is the piezoelectric signal PS.

Figure 5:
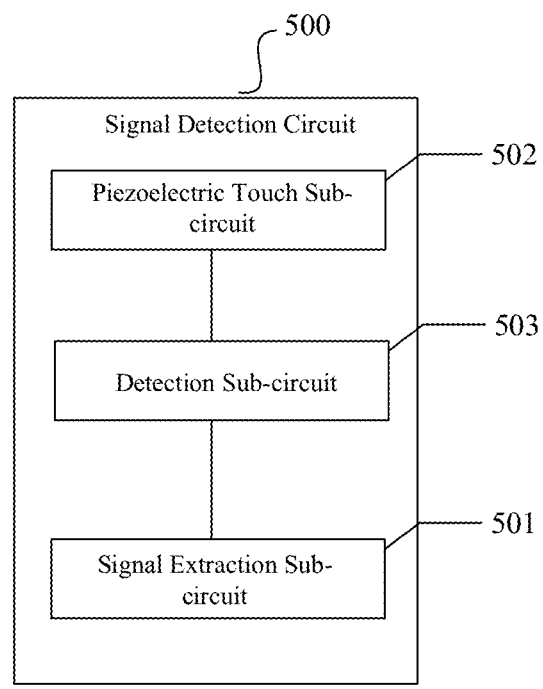
FIG. 5 is a structural schematic diagram illustrating a signal detection circuit according to an exemplary embodiment of the present disclosure.

A signal detection circuit is also provided in an exemplary embodiment of the present disclosure. FIG. 5 is a structural schematic diagram illustrating a signal detection circuit. As shown in FIG. 5, the signal detection circuit 500 includes a signal extraction sub-circuit 501, a piezoelectric touch sub-circuit 502 and a detection sub-circuit 503, wherein the extraction sub-circuit 501 has the same structure as that of the signal extraction circuit 300 in the present disclosure; the piezoelectric touch sub-circuit 502 generates a first sensing signal and a second sensing signal under the driving of a driving signal; and the detection sub-circuit 503 outputs the first signal $Sn_1$ and the second signal $Sn_2$ to the signal extraction sub-circuit 501 according to the first sensing signal and the second sensing signal.

Figure 6:
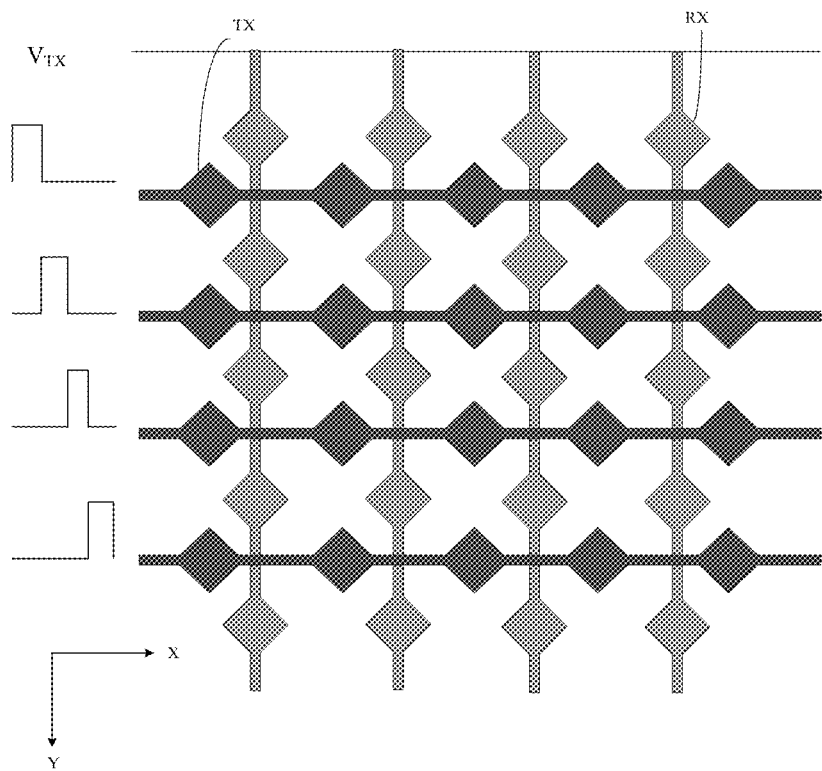
FIG. 6 is a structural schematic diagram illustrating a piezoelectric touch sub-circuit according to an exemplary embodiment of the present disclosure.

In an exemplary embodiment of the present disclosure, FIG. 6 is a structural schematic diagram illustrating the piezoelectric touch sub-circuit 502. As shown in FIG. 6, the piezoelectric touch sub-circuit 502 includes a sensing electrode layer, a driving electrode layer, and a piezoelectric layer (not shown), wherein the sensing electrode layer includes a plurality of sensing electrodes RX distributed in a first direction, the driving electrode layer includes a plurality of driving electrodes TX distributed in a second direction, the first direction intersects the second direction, and the piezoelectric layer is positioned between the sensing electrode layer and the driving electrode layer. The first direction may be a horizontal direction or a vertical direction, or may be a direction at any other angle. Correspondingly, the second direction may be a vertical direction or a horizontal direction, or may be another direction that forms a certain angle relative to the first direction. A material for forming the piezoelectric layer may be a piezoelectric material commonly used in the art, such as PVDF, P(VDF-TrFE), which will not be elaborated herein.

In an exemplary embodiment of the present disclosure, the piezoelectric touch sub-circuit 502 applies a driving signal $V_{TX}$ on the driving electrode layer such that a projected capacitance is generated between the driving electrode layer and the sensing electrode layer. The driving signal $V_{TX}$ in the present disclosure may be a square wave pulse signal, a rectangular wave pulse signal, a sine wave signal, or may be other driving signals commonly used in the art. For convenience of explanation, descriptions will be made below by taking an example in which the driving signal $V_{TX}$ is the square wave pulse signal.

Figure 7:
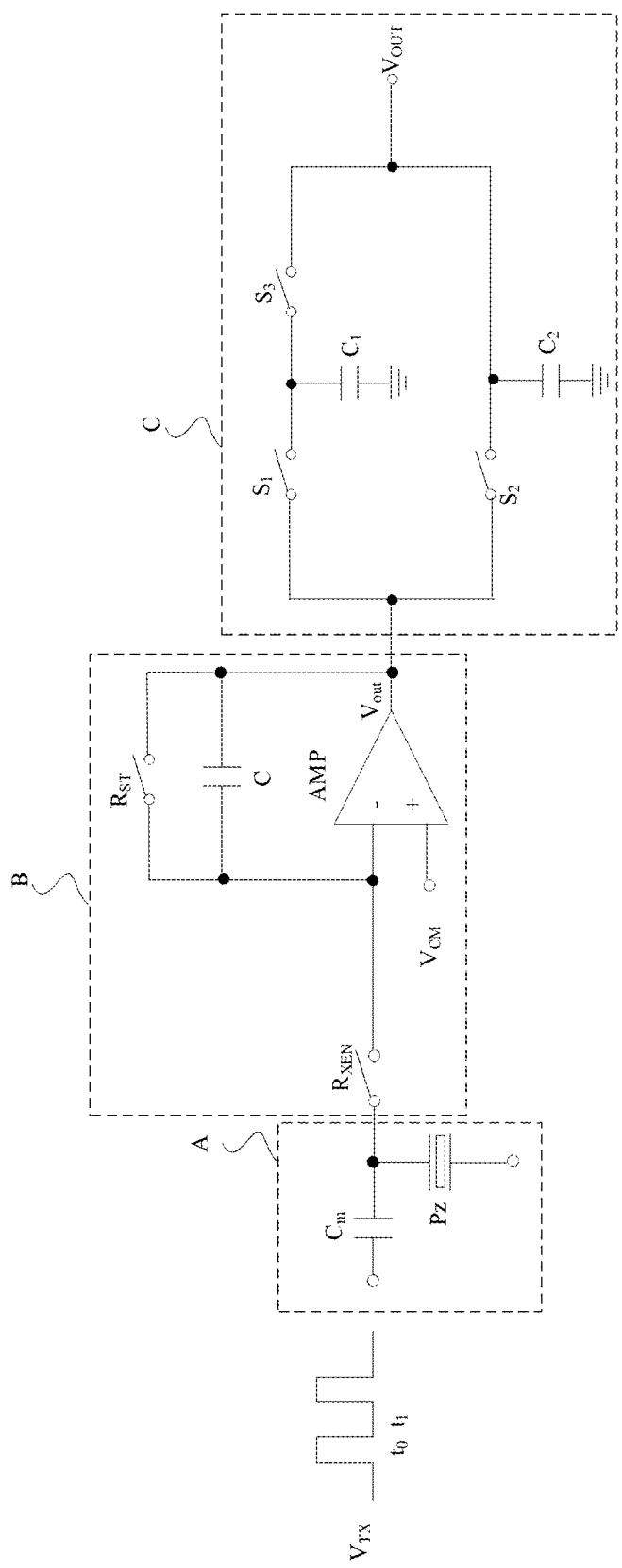
FIG. 7 is a circuit diagram illustrating a signal detection circuit illustrating an exemplary embodiment of the present disclosure.

In an exemplary embodiment of the present disclosure, FIG. 7 is a circuit diagram illustrating a signal detection circuit, in which part A is a structural schematic diagram illustrating the piezoelectric touch sub-circuit 502. As shown in FIG. 7, a capacitor Cm is a projected capacitor created between the sensing electrode layer and the driving electrode layer. A piezoelectric layer $P_z$ is disposed between the sensing electrode layer and the driving electrode layer, and a bias voltage $V_B$ is applied to the piezoelectric layer $P_z$. The piezoelectric touch sub-circuit 502 generates a touch signal TC and a piezoelectric signal PS which are superposed under the driving of the driving signal $V_{TX}$, wherein the driving signal $V_{TX}$ is at a high level during the time period of $t_0$ and is at a low level during the time period of $t_1$.

In an exemplary embodiment of the present disclosure, part B of FIG. 7 is a structural schematic diagram illustrating the detection sub-circuit 503. As shown in FIG. 7, the detection sub-circuit 503 includes an amplifier AMP, a control switch $R_{XEN}$, and a reset switch $R_{ST}$, wherein a negative terminal of the amplifier is virtually grounded, and the negative terminal of the amplifier and a $V_{CM}$ terminal are equipotential; the control switch $R_{XEN}$ can be used to control contact of the sensing electrode layer in the piezoelectric touch sub-circuit 502 with the detection sub-circuit 503, therefore, releasing of piezoelectric charges on the sensing electrode layer is avoided during a reset stage of the detection sub-circuit 503; the reset switch $R_{ST}$ is used to reset the amplifier AMP when the control switch $R_{XEN}$ is turned off. The piezoelectric touch sub-circuit 502 outputs a signal under the driving of the driving signal $V_{TX}$, which is transmitted to the amplifier AMP and amplified, and the detection sub-circuit 503 outputs an output signal $V_{out}$, which is transmitted to the signal extraction sub-circuit 501 (part C) for processing.

Figure 8:
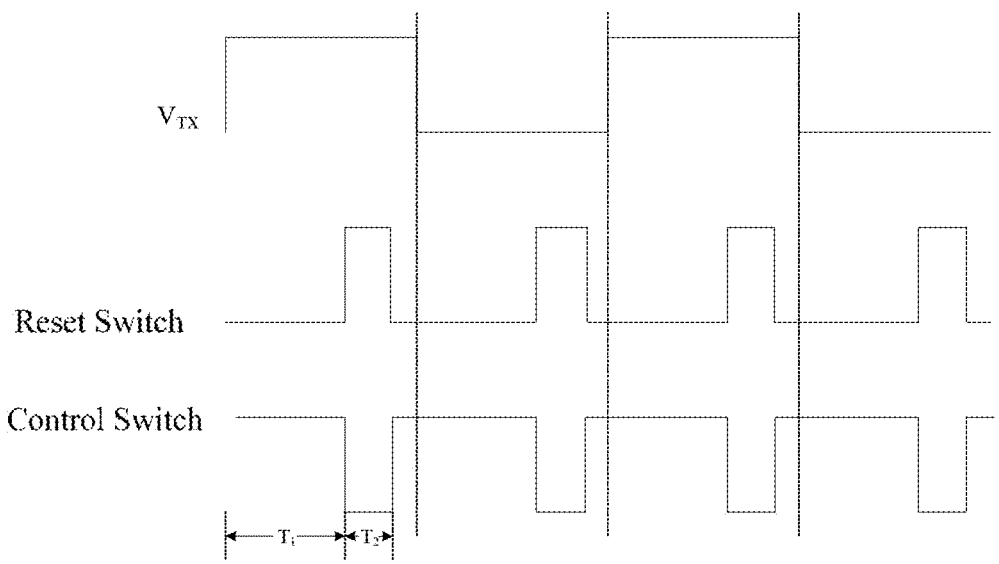
FIG. 8 is a sequence diagram illustrating driving of a piezoelectric touch sub-circuit by a square wave pulse signal according to an exemplary embodiment of the present disclosure.

FIG. 8 is a sequence diagram illustrating the driving of the piezoelectric touch sub-circuit by the square wave pulse signal. As shown in FIG. 8, during a first half period or a second half period of the driving signal $V_{TX}$, and during the first time period $T_1$, the control switch $R_{XEN}$ is turned on, and the reset switch $R_{ST}$ is turned off, such that the piezoelectric touch signal on the sensing electrode layer is transmitted to the amplifier AMP and is amplified by the amplifier AMP, further, an output signal $V_{out}$ is outputted from an output terminal of the detection sub-circuit 503, and is transmitted to the signal extraction sub-circuit 501. During the second time period $T_2$, the control switch $R_{XEN}$ is turned off, the reset switch $R_{ST}$ is turned on, so that the piezoelectric charges are still retained on the sensing electrode layer, meanwhile, the amplifier AMP is reset; and a sum of the first time period $T_1$ and the second time period $T_2$ is less than half of a cycle of the square wave pulse signal.

Figure 9:
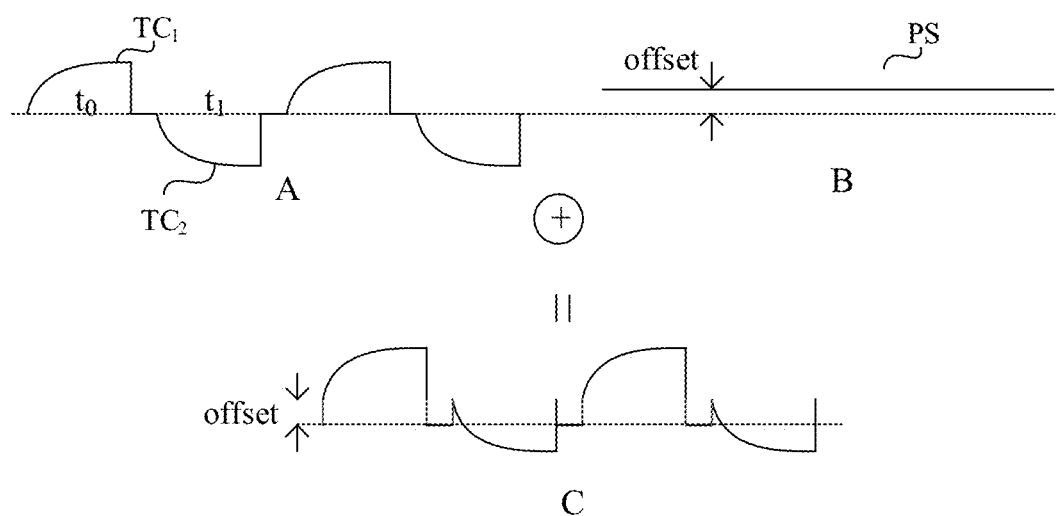
FIG. 9 is a waveform graph of a piezoelectric touch signal according to an exemplary embodiment of the present disclosure.

In an exemplary embodiment of the present disclosure, the touch signal and the piezoelectric signal are superimposed, and the touch signal TC is added to the driving signal $V_{TX}$, which is rapidly varied, and the piezoelectric signal PS is a slowly varying voltage, the two are superimposed to form the piezoelectric touch signal, which is amplified by the amplifier AMP and transmitted to the signal extraction sub-circuit 501. FIG. 9 is a waveform graph of the piezoelectric touch signal, wherein a waveform graph of the touch signal is as shown in FIG. 9A, and a waveform graph of the piezoelectric signal is as shown in FIG. 9B, and the superposed piezoelectric touch signal is as shown in FIG. 9C.

Figure 10:
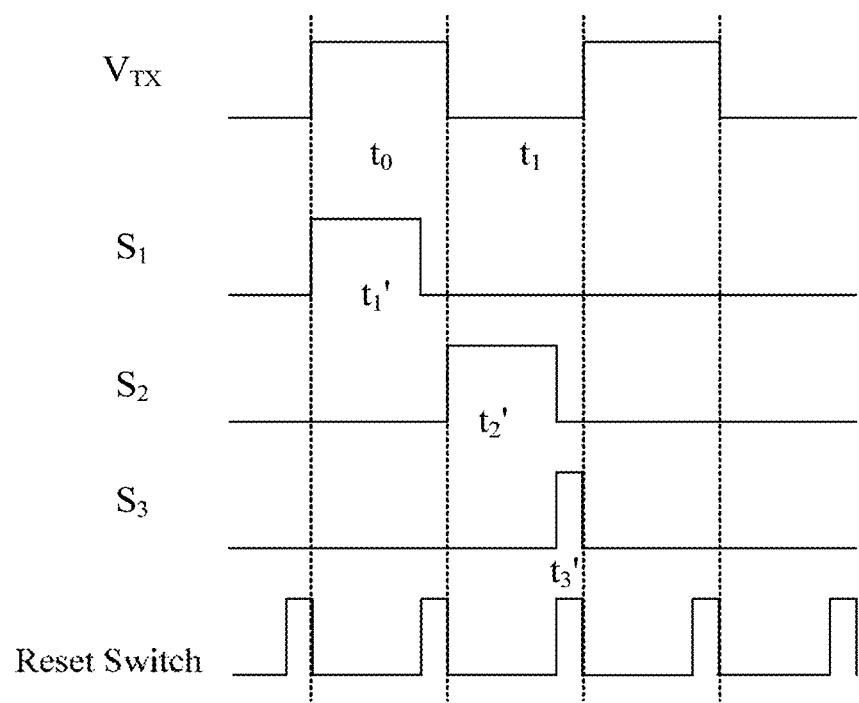
FIG. 10 is a sequence diagram illustrating signals of a signal detection circuit according to an exemplary embodiment of the present disclosure.

In an exemplary embodiment of the present disclosure, the amplified piezoelectric touch signal is outputted from the output terminal of the detection sub-circuit 503 and then enters the signal extraction sub-circuit 501. FIG. 10 is a sequence diagram of a signal of the signal detection circuit. As shown in FIG. 10, when the driving signal $V_{TX}$ is at a high level, during a first time period $t_1'$, the first switch $S_1$ is turned on, the second switch $S_2$ is turned off, and the piezoelectric touch signal is stored on the first capacitor $C_1$. The piezoelectric touch signal may be $V_{TC}+V_{PS}$ ($V_{TC}$ is a voltage corresponding to the touch signal, and $V_{PS}$ is a voltage corresponding to the piezoelectric signal). When the driving signal $V_{TX}$ is at a low level, during a second time period $t_2'$, the first switch $S_1$ is turned off, the second switch $S_2$ is turned on, and the piezoelectric touch signal is stored on the second capacitor $C_2$, and the piezoelectric touch signal can be $-V_{TC}+V_{PS}$. When the driving signal $V_{TX}$ is at a low level, during a third time period $t_3'$, the first switch $S_1$ and the second switch $S_2$ are both turned off, the third switch $S_3$ is turned on, and a voltage signal $V_{OUT}$ is outputted from an output terminal of the signal extraction circuit 501. The first time period $t_1'$ and the second time period $t_2'$ have the same time of duration, and a sum of the first time period $t_1'$ and the third time period $t_3'$ is equal to a sum of the second time period $t_2'$ and the third time period $t_3'$, which is half of the cycle of the square wave pulse signal.

In an exemplary embodiment of the present disclosure, the first switch $S_1$ may also be turned on when the driving signal $V_{TX}$ is at a low level, and the second switch $S_2$ and the third switch $S_3$ may be turned on when the driving signal $V_{TX}$ is at a high level.

In an exemplary embodiment, the first capacitor $C_1$ and the second capacitor $C_2$ have the same capacitance value in the present disclosure, and according to a calculation formula of a capacitor voltage:

$$V_{OUT}=[C_1\times(V_{TC}+V_{PS})+C_2\times(-V_{TC}+V_{PS})]/(C_1+C_2)=V_{PS}$$

As can be seen from the above, the voltage signal $V_{OUT}$ outputted from the signal extraction circuit 501 is the piezoelectric signal PS, that is, the signal extraction circuit 501 separates and extracts the piezoelectric signal PS from the piezoelectric touch signal.

Figure 11:
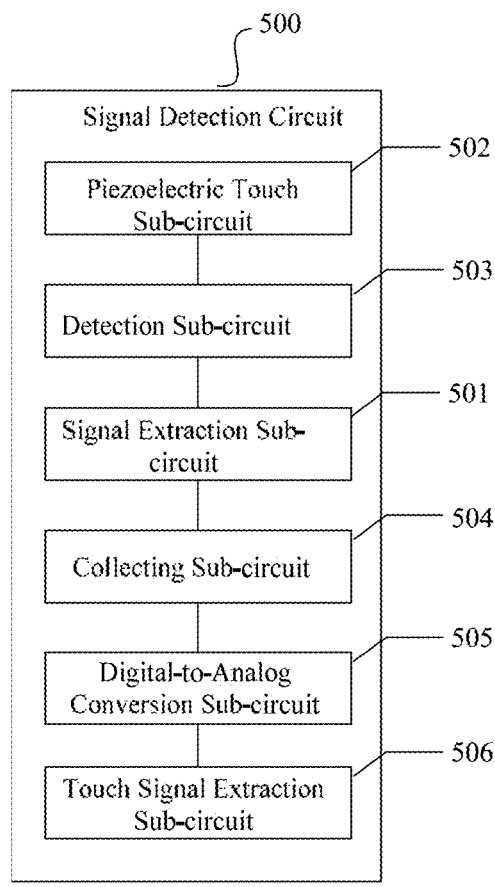
FIG. 11 is a structural schematic diagram illustrating a signal detection circuit according to an exemplary embodiment of the present disclosure.
Figure 12:
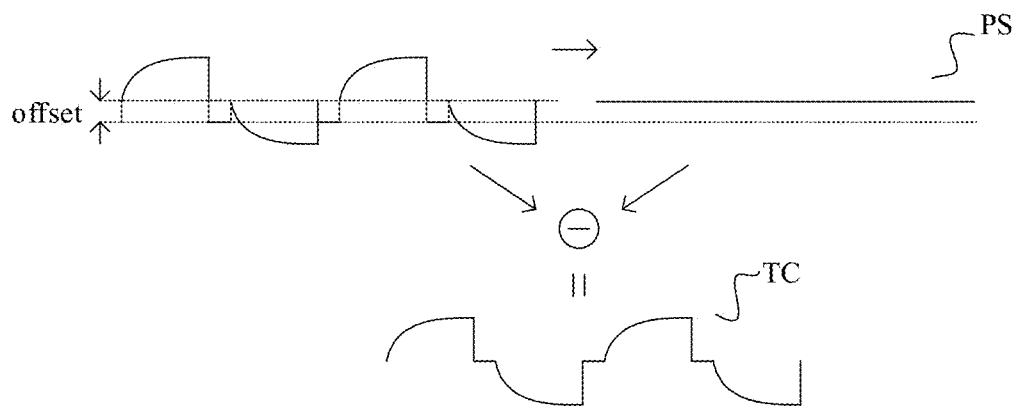
FIG. 12 is a waveform graph of extraction of a touch signal according to an exemplary embodiment of the present disclosure.

In an exemplary embodiment of the present disclosure, FIG. 11 is a structural schematic diagram illustrating a signal detection circuit. As shown in FIG. 11, the signal detection circuit 500 may further include a collecting sub-circuit 504 configured to collect the first signal $Sn_1$, the second signal $Sn_2$, and the piezoelectric signal PS. In an exemplary embodiment, the signal detection circuit 500 may further include a digital-to-analog conversion sub-circuit 505 configured to receive the first signal $Sn_1$, the second signal $Sn_2$, and the piezoelectric signal PS collected by the collecting sub-circuit 504, and convert the signals into a digital signal. In order to obtain the touch signal, in an exemplary embodiment, the signal detection circuit 500 in the present disclosure may include a touch signal extraction sub-circuit 506 configured to subtract the digital signal converted by the digital-to-analog conversion sub-circuit 505 from a digital signal corresponding to the piezoelectric touch signal PS to obtain the touch signal TC. FIG. 12 is a waveform graph of the extracted touch signal. As shown in FIG. 12, after the piezoelectric signal PS outputted from the signal extraction circuit 501 is converted into the digital signal, the touch signal TC is obtained by subtracting the piezoelectric signal PS from the piezoelectric touch signal.

In an exemplary embodiment of the present disclosure, the pre-extracted piezoelectric signal can be used for comparison and determining whether a display panel is touched by an object such as a finger or a pen, it is not necessary to start up some complicated high-power circuits in advance, for example, digital processing circuits such as an analog-to-digital converter, a digital filter, in this way, the power consumption of the chip can be effectively saved and the touch can be accurately determined.

Figure 13:
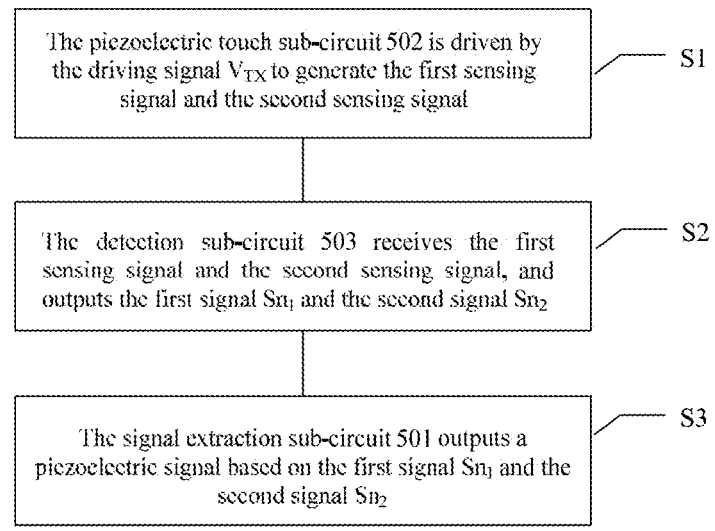
FIG. 13 is a flowchart showing a signal detection method according to an exemplary embodiment of the present disclosure.

A signal detection method is also provided in this exemplary embodiment for the signal detection circuit 500 described above. FIG. 13 is a flow chart showing the signal detection method. The specific procedures are shown in FIG. 13.

In a step S1: the piezoelectric touch sub-circuit 502 is driven by the driving signal $V_{TX}$ to generate the first sensing signal and the second sensing signal.

In a step S2: the detection sub-circuit 503 receives the first sensing signal and the second sensing signal, and outputs the first signal $Sn_1$ and the second signal $Sn_2$;

In a step S3: the signal extraction sub-circuit 501 outputs a piezoelectric signal based on the first signal $Sn_1$ and the second signal $Sn_2$.

By applying the signal detection method in the present disclosure to the signal detection circuit in the present disclosure, the touch signal and the piezoelectric signal can be simultaneously acquired, and the power consumption of the chip can be effectively saved.

Figure 14:
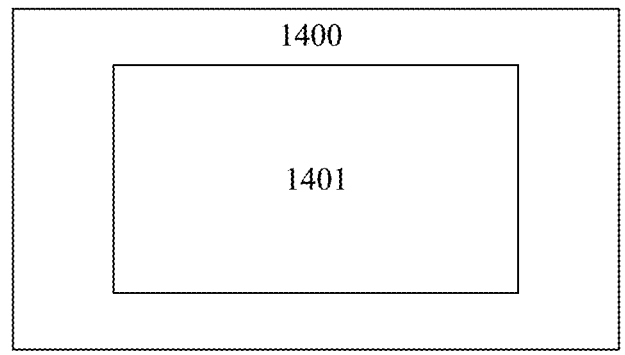
FIG. 14 is a structural schematic diagram illustrating a touch panel according to an exemplary embodiment of the present disclosure.

A touch panel is further provided in an exemplary embodiment. As shown in FIG. 14, the touch panel 1400 includes a signal detection circuit 1401, which is the signal detection circuit in the present disclosure.

Figure 15:
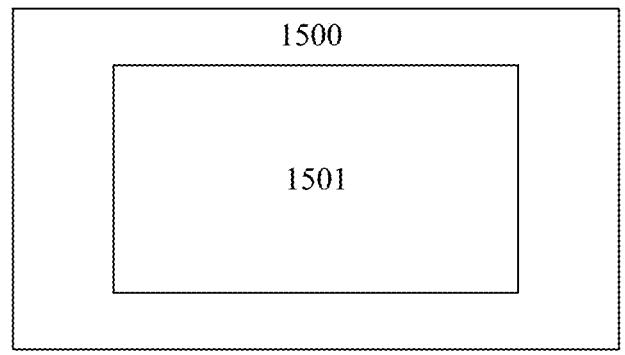
FIG. 15 is a structural schematic diagram illustrating a display device according to an exemplary embodiment of the present disclosure.

A display device is also provided in the present exemplary embodiment. As shown in FIG. 15, the display device 1500 includes a touch panel 1501, which is the touch panel in the present disclosure. The display device 1500 may be a product or component having a display function, such as an electronic paper, an OLED display, a mobile phone, a tablet computer, a television, a notebook computer, a digital photo frame, a navigator, and the like.

Other embodiments of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A signal extraction circuit, comprising:
   a first storage sub-circuit connected to an input terminal and configured to receive and store a first signal inputted from the input terminal during a first time period, the first signal comprising a first touch signal and a piezoelectric signal which are superimposed;
   a second storage sub-circuit connected to the input terminal and configured to receive and store a second signal inputted from the input terminal during a second time period, the second signal comprising a second touch signal and a piezoelectric signal which are superimposed, and a phase of the second touch signal being opposite to a phase of the first touch signal;
   an output sub-circuit connected to the first storage sub-circuit, the second storage sub-circuit, and an output terminal and configured to output the piezoelectric signals from the output terminal based on the first signal and the second signal during a third time period;
   wherein the first time period and the second time period are different time periods having the same time of duration in a touch event.

2. The signal extraction circuit according to claim 1, wherein the first storage sub-circuit comprises a first switch and a first capacitor, a first terminal of the first switch is configured to receive the first signal, a second terminal of the first switch is connected to a first terminal of the first capacitor, and a second terminal of the first capacitor is grounded.

3. The signal extraction circuit according to claim 1, wherein the second storage sub-circuit comprises a second switch and a second capacitor, a first terminal of the second switch is configured to receive the second signal, a second terminal of the second switch is connected to a first terminal of the second capacitor, and a second terminal of the second capacitor is grounded.

4. The signal extraction circuit according to claim 2, wherein the output sub-circuit comprises a third switch, a first terminal of the third switch is connected to the first terminal of the first capacitor, and a second terminal of the third switch is configured to output the piezoelectric signals.

5. A signal detection circuit, comprising:
- a signal extraction sub-circuit which is the signal extraction circuit according to claim 1;
- a piezoelectric touch sub-circuit configured to generate a first sensing signal and a second sensing signal under the driving of a driving signal; and
- a detection sub-circuit connected to the piezoelectric touch sub-circuit and the signal extraction sub-circuit and configured to output the first signal and the second signal to the signal extraction sub-circuit according to the first sensing signal and the second sensing signal.

6. The signal detection circuit according to claim 5, wherein the first storage sub-circuit comprises a first switch and a first capacitor, a first terminal of the first switch is configured to receive the first signal, a second terminal of the first switch is connected to a first terminal of the first capacitor, and a second terminal of the first capacitor is grounded.

7. The signal detection circuit according to claim 5, wherein the second storage sub-circuit comprises a second switch and a second capacitor, a first terminal of the second switch is configured to receive the second signal, a second terminal of the second switch is connected to a first terminal of the second capacitor, and a second terminal of the second capacitor is grounded.

8. The signal detection circuit according to claim 6, wherein the output sub-circuit comprises a third switch, a first terminal of the third switch is connected to the first terminal of the first capacitor, and a second terminal of the third switch is configured to output the piezoelectric signals.

9. The signal detection circuit according to claim 5, wherein the piezoelectric touch sub-circuit comprises:
- a sensing electrode layer comprising a plurality of sensing electrodes distributed in a first direction;
- a driving electrode layer comprising a plurality of driving electrodes distributed in a second direction which intersects the first direction; and
- a piezoelectric layer positioned between the sensing electrode layer and the driving electrode layer.

10. The signal detection circuit according to claim 6, wherein the piezoelectric touch sub-circuit comprises:
- a sensing electrode layer comprising a plurality of sensing electrodes distributed in a first direction;
- a driving electrode layer comprising a plurality of driving electrodes distributed in a second direction which intersects the first direction; and
- a piezoelectric layer positioned between the sensing electrode layer and the driving electrode layer.

11. The signal detection circuit according to claim 5, wherein the detection sub-circuit comprises:
- an amplifier configured to generate the first signal and the second signal according to the first sensing signal and the second sensing signal;
- a control switch configured to control turn-on or turn-off of the piezoelectric touch sub-circuit and the amplifier; and
- a reset switch configured to reset the amplifier when the control switch is turned off.

12. The signal detection circuit according to claim 6, wherein the detection sub-circuit comprises:
- an amplifier configured to generate the first signal and the second signal according to the first sensing signal and the second sensing signal;
- a control switch configured to control turn-on or turn-off of the piezoelectric touch sub-circuit and the amplifier; and
- a reset switch configured to reset the amplifier when the control switch is turned off.

13. The signal detection circuit according to claim 5, further comprising:
- a collecting sub-circuit configured to collect the first signal, the second signal, and the piezoelectric signal;
- an analog-to-digital conversion sub-circuit configured to convert the collected first signal, second signal, and piezoelectric signal into digital signals; and
- a touch signal extraction sub-circuit configured to subtract the digital signals of the first signal and the second signal from the digital signal of the piezoelectric signal to generate the touch signal.

14. The signal detection circuit according to claim 6, further comprising:
- a collecting sub-circuit configured to collect the first signal, the second signal, and the piezoelectric signal;
- an analog-to-digital conversion sub-circuit configured to convert the collected first signal, second signal, and piezoelectric signal into digital signals; and
- a touch signal extraction sub-circuit configured to subtract the digital signals of the first signal and the second signal from the digital signal of the piezoelectric signal to generate the touch signal.

15. A signal detection method, which is applied to a signal detection circuit, wherein the signal detection circuit comprises:
- a signal extraction sub-circuit comprising: a first storage sub-circuit connected to an input terminal and configured to receive and store a first signal inputted from the input terminal during a first time period, the first signal comprising a first touch signal and a piezoelectric signal which are superimposed; a second storage sub-circuit connected to the input terminal and configured to receive and store a second signal inputted from the input terminal during a second time period, the second signal comprising a second touch signal and a piezoelectric signal which are superimposed, and a phase of the second touch signal being opposite to a phase of the first touch signal; an output sub-circuit connected to the first storage sub-circuit, the second storage sub-circuit, and an output terminal and configured to output the piezoelectric signals from the output terminal based on the first signal and the second signal during a third time period; wherein the first time period and the second time period are different time periods having the same time of duration in a touch event;
- a piezoelectric touch sub-circuit configured to generate a first sensing signal and a second sensing signal under the driving of a driving signal; and a detection sub-circuit connected to the piezoelectric touch sub-circuit and the signal extraction sub-circuit and configured to output the first signal and the second signal to the signal extraction sub-circuit according to the first sensing signal and the second sensing signal;

wherein the signal detection method comprises:

driving the piezoelectric touch sub-circuit by a driving signal to generate the first sensing signal and the second sensing signal;

the detection sub-circuit receiving the first sensing signal and the second sensing signal, and outputting the first signal and the second signal; and the signal extraction sub-circuit outputting the piezoelectric signal according to the first signal and the second signal.

16. The signal detection method according to claim 15, wherein the first storage sub-circuit comprises a first switch and a first capacitor, a first terminal of the first switch is configured to receive the first signal, a second terminal of the first switch is connected to a first terminal of the first capacitor, and a second terminal of the first capacitor is grounded.

17. The signal detection method according to claim 15, wherein the second storage sub-circuit comprises a second switch and a second capacitor, a first terminal of the second switch is configured to receive the second signal, a second terminal of the second switch is connected to a first terminal of the second capacitor, and a second terminal of the second capacitor is grounded.

18. The signal detection method according to claim 16, wherein the output sub-circuit comprises a third switch, a first terminal of the third switch is connected to the first terminal of the first capacitor, and a second terminal of the third switch is configured to output the piezoelectric signals.

19. A touch panel, comprising the signal detection circuit according to claim 5.

20. A display device, comprising the touch panel according to claim 19.

* * * * *